United States Patent [19]

Mimasaka et al.

[11] Patent Number: 5,020,200
[45] Date of Patent: Jun. 4, 1991

[54] APPARATUS FOR TREATING A WAFER SURFACE

[75] Inventors: Masahiro Mimasaka; Hiroyuki Hirai, both of Kyoto, Japan

[73] Assignee: Dainippon Screen Mfg. Co., Ltd., Kyoto, Japan

[21] Appl. No.: 574,164

[22] Filed: Aug. 29, 1990

[30] Foreign Application Priority Data

Aug. 31, 1989 [JP] Japan ................................ 1-227140

[51] Int. Cl.$^5$ ............................................. H01L 41/00
[52] U.S. Cl. .................................. 29/25.01; 134/902; 118/319; 118/321; 118/629; 118/730
[58] Field of Search ............... 29/25.01; 134/902, 153; 118/319, 321, 629, 631, 730

[56] References Cited

U.S. PATENT DOCUMENTS

| | | | |
|---|---|---|---|
| 3,727,620 | 4/1973 | Orr | 134/153 |
| 3,799,178 | 3/1974 | Anderson et al. | 134/153 |
| 4,027,686 | 6/1977 | Shortes et al. | 134/902 |
| 4,064,885 | 12/1977 | Dussault et al. | 134/902 |
| 4,326,553 | 4/1962 | Hall | 134/153 |
| 4,416,213 | 11/1983 | Sakiya | 118/321 |
| 4,564,280 | 1/1986 | Fukuda | 134/153 |
| 4,871,417 | 10/1989 | Nishizawa et al. | 156/640 |
| 4,941,489 | 7/1990 | Kamimura et al. | 134/902 |

FOREIGN PATENT DOCUMENTS

| | | |
|---|---|---|
| 59-12663 | 7/1984 | Japan . |
| 61-160930 | 7/1986 | Japan . |
| 63-50125 | 4/1988 | Japan . |

Primary Examiner—Olik Chaudhuri
Assistant Examiner—Long Pham
Attorney, Agent, or Firm—Lowe, Price, LeBlanc and Becker

[57] ABSTRACT

An apparatus for treating a surface of a wafer includes a wafer-holding device for holding the wafer horizontally at the center of the lower surface of the wafer to rotate the wafer around a predetermined rotation axis and a nozzle for supplying a flow of treatment liquid to the upper surface of the wafer held by the wafer holding device. The nozzle includes a supply member for supplying the treatment liquid at a predetermined flow speed at a predetermined position located higher than the upper surface of the wafer, and a member for changing the flow speed of the treatment liquid to a smaller speed at the predetermined position and providing a flow speed component in a direction parallel to the upper surface of the wafer. The flow speed of the treatment liqid at the predetermined position is thus controlled and the treatment liquid flow reaches the wafer upper surface with a speed component parallel to the upper surface of the wafer. The speed of the treatment liquid flow is kept sufficiently small so that the treatment liquid reaching the wafer does not cause unevenness on the wafer. Since the treatment liquid flow has a speed component parallel to the upper surface of the wafer it spreads over the wafer smoothly. In another aspect of the invention, the rotation axis is spaced from an axis of the supply member.

18 Claims, 5 Drawing Sheets

APPARATUS FOR TREATING A WAFER SURFACE

BACKGROUND OF THE INVENTION

1. Field of the invention

The present invention relates generally to apparatus to be used for treating surfaces of semiconductor wafers, glass plates for photomasks or the like (hereinafter referred to simply as "wafers"). More particularly, it relates to an apparatus capable of supplying a treatment liquid to an upper surface of a wafer at a stroke and uniformly without causing any unevenness through a nozzle for discharging the treatment liquid.

2. Description of the Related Art

Surface treating apparatus of this type are disclosed in, for example, Japanese Patent Laying-Open Nos. 59-126633 land 61-160930, Japanese Utility Model Laying-Open No. 63-50125, . FIG. 1 shows the apparatus disclosed in Japanese Utility Model Laying-Open No. 63-50125.

Referring to FIG. 1, this apparatus comprises: a spin chuck 101 for holding a wafer W horizontally in a rotatable manner; a nozzle 105 for supplying a treatment liquid Q to the upper surface of the wafer W which is maintained horizontal; means, not shown, for moving the nozzle 105 over the wafer W in a direction shown by an arrow F while the nozzle 105 is supplying the treatment liquid Q; and a cup 110 surrounding the wafer W, for preventing scattering of splashes of the treatment liquid. This apparatus is disposed between a wafer conveying unit 111 for conveying the wafer to an apparatus for a posterior processing and a wafer transferring unit 112 for transferring the wafer W to the spin chuck 101.

The wafer carrying unit 111 includes elongated 0-rings 113 on which the wafer is to be moved toward the apparatus for the posterior processing, and pulleys 114 for rotating the 0-rings 113 in a predetermined direction.

The apparatus further has a lifting unit, not shown, for moving the spin chuck 101 vertically.

Referring to FIGS. 1 and 2, this known apparatus operates as follows. First, the spin chuck 101 is raised by the lifting unit so that the top portion of the chuck is at the same level as a plane at which the wafer W is transported. The wafer transferring unit 112 then moves a wafer W on the spin chuck 101. The spin chuck 101 holds the wafer W by a mechanical device or a vacuum contact mechanism. The spin chuck 101 is lowered to a prescribed position while holding the wafer W. When the spin chuck 101 lowers the wafer W to a prescribed level, it rotates the wafer W horizontally. i.e. about a vertical axis over the wafer W in the direction of the arrow F while dispersing the treatment liquid Q through an outlet hole 108 onto the upper surface of the wafer W. See FIG. 2.

The treatment liquid Q is dispersed downward in a fanwise manner to cover the whole surface of the wafer W. Since the wafer W is rotating, excess treatment liquid scatters around the rotating wafer. The scattering treatment liquid strikes against the inner surface of the cup 110 flows downward along the inner surface of the cup 110 and is collected at the bottom.

After a layer of the treatment liquid is formed on the wafer W, the nozzle 105 is moved to a position that does not obstruct vertical movement of the wafer W. The spin chuck 101 raises again the wafer W to the level defined by the wafer conveying unit 111 and the wafer carrying unit 112. The wafer transferring unit 112 receives the wafer W from the spin chuck 1001 and places the wafer on the unit 111, and the wafer is transferred for subsequent processing.

In the above-described conventional apparatus, the treatment liquid Q is dispersed downward in a fanwise manner. Consequently, a sufficient amount of the treatment liquid is supplied uniformly over the whole surface of the wafer. However, this apparatus has certain disadvantages, as described below.

In order to enable the fanwise scattering treatment liquid to cover the entire upper surface of the wafer W, it is necessary to locate the nozzle 105 at a position that is sufficiently high relative to the wafer W. The location of the nozzle 105 is therefore to be higher than the wafer W by 5cm or more. In addition, it is necessary to apply a certain pressure to the treatment liquid to be supplied to the nozzle 105. For instance, it is necessary to apply pressure of about 0.6 kg/cm$^2$ to the treatment liquid. Because of the application of the pressure to the treatment liquid and the level difference between the nozzle and the surface of the wafer W, the treatment liquid scattering like a shower strikes on the surface of the wafer W, causing an inherent unevenness on the wafer W. This unevenness lowers the yield of production of wafers for which a high quality is required.

SUMMARY OF THE INVENTION

Accordingly, an object of the present invention is to provide an apparatus for treating a surface of a wafer, which can solve the above-described problems and improve a yield of high quality wafers.

Another object of the present invention is to provide an apparatus for treating a surface of a wafer without causing any unevenness on the wafer surface.

An additional object of the present invention is to provide an apparatus for treating a surface of a wafer, which is capable of supplying a treatment liquid without any shock to the wafer surface.

The apparatus according to the, present invention is for treating a surface of a wafer, the wafer having a first surface that is to be treated and a second surface opposite thereto. This apparatus includes a wafer holding device for holding the wafer at the center of its second surface rotatably around a predetermined rotation axis, and a nozzle for supplying a treatment liquid to the first surface of the wafer held by the wafer holding device. The nozzle includes a supply member for supplying the treatment liquid flowing at a prescribed first speed at a predetermined position higher than the first surface by a predetermined distance and a member for changing a speed of flow of the treatment liquid to the first surface by changing the first speed of the treatment liquid to a smaller second speed at the predetermined position and applying a speed component parallel to the first surface.

The flow speed changing member includes an obstruction member for obstructing the flow of the treatment liquid supplied by the supply member at the predetermined position, and a flow allowing member for allowing the treatment liquid obstructed by the obstruction member to flow out from the predetermined position. According to a preferred embodiment of the present invention, the flow allowing member includes a side plate in contact with a peripheral edge of the obstruction member, extending upward from the obstruction member, and having outlet holes through which the treatment liquid flows out.

The supply member supplies the treatment liquid flowing at the first speed to the predetermined position over the first surface. The flow speed changing member changes the speed of the supplied treatment liquid to the smaller second speed at the predetermined position and applies to the flowing liquid a speed component in a direction parallel to the first surface, and then the treatment liquid reaches the first surface. By selecting the first position to be sufficiently near the first surface, it is possible to correspondingly decrease the speed of the treatment liquid in a direction perpendicular to the first surface when the treatment liquid reaches the first surface. Consequently, the flow of treatment liquid does not cause any unevenness on the wafer surface receiving the same . In addition, in a preferred embodiment, a speed component is applied in a direction parallel to the first surface of the wafer to the treatment liquid by the flow speed changing member. In consequence, the treatment liquid reaches the first surface and flows, spreads on, and covers the first surface. The treatment liquid thereby spreads uniformly over the entire upper surface of the wafer, uniformly treating that wafer surface.

According to the invention, the flow of the treatment liquid is temporarily obstructed by the obstruction member so that the speed of the liquid is considerably decreased. After that, the treatment liquid flows out form the predetermined position to the first surface by means of the flow allowing member. Consequently, the speed of the treatment liquid reaching the first surface is reduced and unevenness due to the treatment liquid does not occur on the wafer surface.

According to a preferred embodiment of the invention, the treatment liquid supplied at the predetermined position flows out with a speed component in a direction parallel to the first surface through the outlet holes provided in the side plate. Even if the treatment liquid is being supplied a the first position at a large supply speed, the speed component of the flowing treatment liquid in the vertical direction is thus reduced. Further, the treatment liquid spreads over the wafer surface through a plurality of outlet holes. Thus, it is possible to supply the treatment liquid at a selected rate uniformly over the entire upper surface of the wafer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
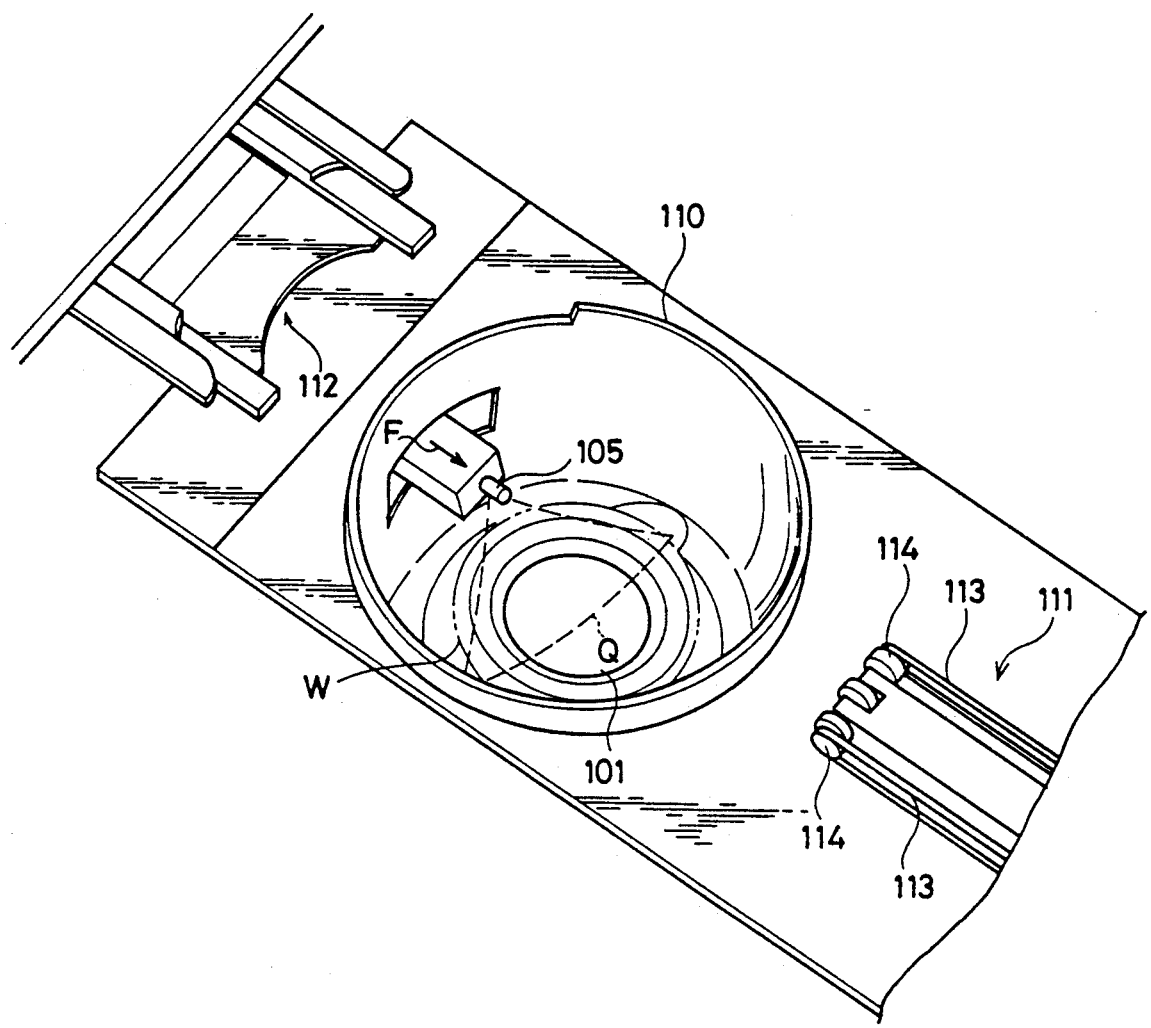
FIG. 1 is a perspective view of a conventional apparatus.

Referring to FIGS. 3 through 5D, an apparatus for treating a surface of a wafer according to a preferred embodiment of the present invention includes: a cup 10 (as shown in FIGS. 5A to 5D) for preventing scattering of a liquid agent such as a developer; a spin chuck 1 provided at the center of the cup 10 for holing a wafer W in a horizontally rotatable manner and moving the wafer W vertically; a nozzle 5 (best seen in FIG. 5B) for supplying a flow of a developer Q to the upper surface of the wafer W held by the spin chuck 1; and means (not shown)for moving the nozzle 5 to a position above the center of the wafer W held by the spin chuck 1.

The spin chuck 1 is rotated horizontally by a known drive means, not shown, through a rotating shaft 2. The spin chuck 1 can be also moved vertically in the cup by a known lifting means (not shown) coupled to the rotating shaft 2.

The nozzle 5 includes a cylindrical body 6 having a closed top end. See FIG. 4. The cylindrical body 6 includes a side wall 6a which forms a hollow cylinder and which is provided with a plurality of outlet holes 8 on its circumference, and a bottom wall 6b which forms a speed reducing chamber 7 by closing the top end of a cylindrical space defined by the side wall 6a, so as to prevent the liquid agent supplied into the cylindrical body 6 from directly reaching the wafer W. The cylindrical body 6 is disposed in a direction perpendicular to the upper surface of the wafer W.

Referring to FIGS. 5A to 5D, the cup 10 includes an upper cup 10a and a lower cup 10b which are separable from each other. The respective cups 10a and 10b can be moved independently.

Figure 5A:
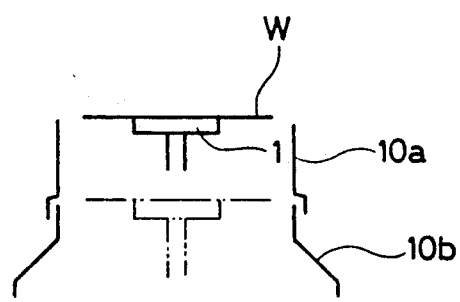
FIGS. 5A to 5D are typical side sectional views for explaining an operation of the apparatus shown in FIGS. 3 and 4.
Figure 5B:
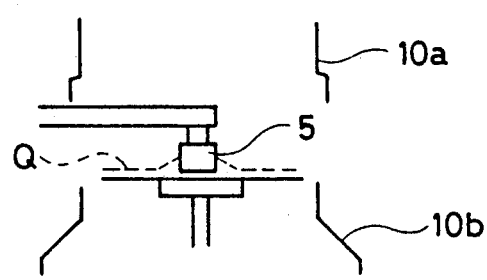
Figure 5C:
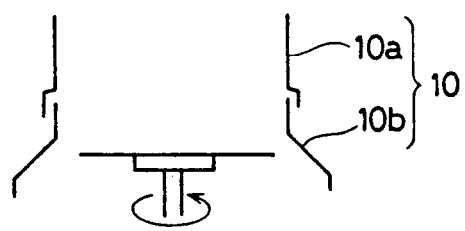

The apparatus according to the first embodiment of the invention operates in the below-described manner. Referring to FIG. 5A, the spin chuck 1 is first raised to the level of an opening in the upper end of the cup 10. The spin chuck 1 receives the wafer W by wafer conveying and transferring units similar to those in the prior art and holds the lower surface of the wafer W by a vacuum contact element or the like. The spin chuck 1 holds and lowers the wafer W to a position shown by the broken line line. In FIG. 5A As illustrated in FIG. 5B, the upper cup 10a is then raised to a prescribed level. The nozzle 5 is moved to be over the central portion of the wafer W. At this time, nozzle 5 is located close to the upper surface of the wafer W. The nozzle 5 is then supplied with a flow of a liquid developer.

Figure 4:
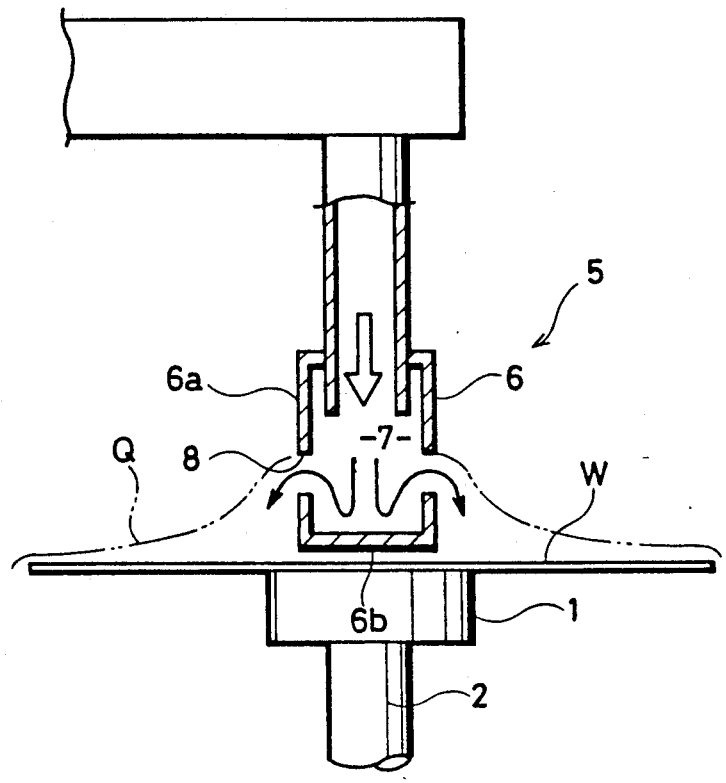
FIG. 4 is a partial vertical sectional view of the apparatus shown in FIG. 3.

Referring to FIG. 4, the supplied developer flow experiences a reduction in its speed in the chamber 7 and is temporarily stored dwells therein. The developer Q then flows out from the chamber 7 holes onto the upper surface of the wafer W through the plurality of outlet 8. At this time, the spin chuck 1 is stopped, or rotated at a low speed. Since the developer Q flows out from the outlet holes 8 onto the wafer W, the developer Q spreads over the entire upper surface of the wafer W. If the wafer W is rotating together with the spin chuck 1, the developer Q spreads over the upper surface of the wafer W more efficiently.

Prior to the supply of the developer onto the wafer W, in some cases, dust is purged away from the surface of, the wafer W by blowing nitrogen gas onto the upper surface of the wafer W, or the surface of the wafer W is a pre-wet treatment or the like in which the surface of the wafer W is made wet in advance by a diluted developer.

After a sufficient amount of developer Q is supplied to the surface of the wafer W, the nozzle 5 recedes, and the lower cup 10b is raised to a position in contact with the upper cup 10a. See FIG. 5C. Thus, the inclined surface of the lower cup 10b starts about at the same level as the wafer W held by the spin chuck 1. The wafer W is held in this state for an appropriate developing time (e.g., 30 to 80 seconds, typically 60 seconds). After that, the cup 10 and the spin chuck 1 as well as the wafer W are held in the position shown in FIG. 5C and the spin chuck 1 is rotated at a high speed. A rinsing liquid, e.g., high-purity water, is thereafter supplied onto the wafer W. Thus, the developer is washed away from the surface of the wafer W.

Figure 5D:
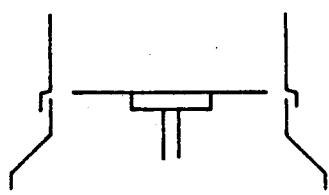

Referring to FIG. 5D, after the developer is removed from the surface of the wafer W, the upper cup 10a and the lower cup 10b are simultaneously lowered to an operation end position. Further, the spin chuck 1 is raised to the position shown in FIG. 5A, whereby the wafer W is positioned in the opening of the upper end of the cup 10. The wafer W is thereafter taken out from this apparatus by means of a known conveying device, not shown.

The above-described sequence of operations shown in FIGS. 5A to 5D is repeated, whereby wafers successively undergo the development process.

In the above-described apparatus, the flow of developer supplied through the nozzle 5 is obstructed by the bottom wall 6b and is temporarily stored in the speed reducing chamber 7. After that, the developer passes through the outlet holes 8 provided in the side wall 6a and flows in a direction generally parallel to the surface of the wafer W. The nozzle 5 is maintained in a position, sufficiently close to the upper surface of the wafer W while this occurs. Consequently, the developer flowing out through the outlet holes 8 reaches the surface of the wafer with little shock and spreads out over the surface of the wafer W. Thus, the kind of unevenness as is caused in the conventional apparatus does not occur on the surface of the wafer W.

Figure 6:
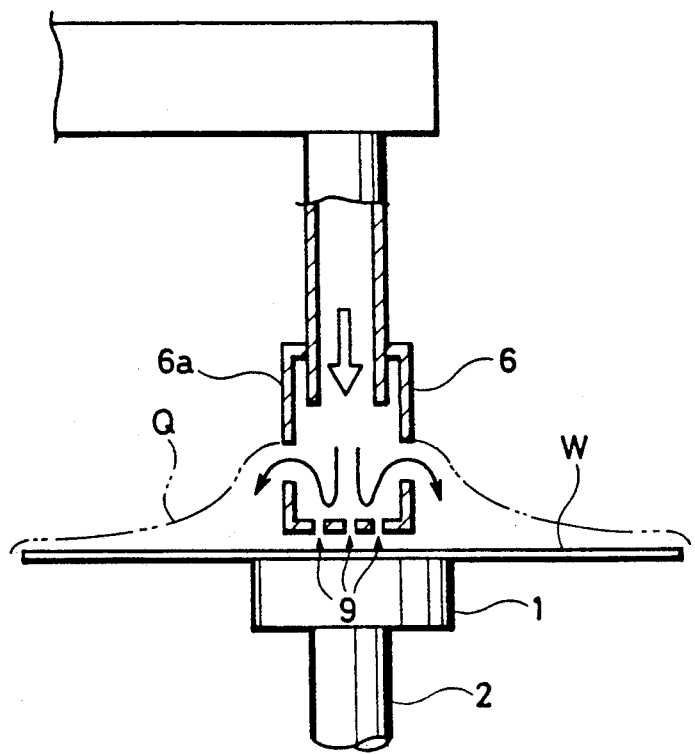
FIG. 6 is a partial fragmentary side view of an apparatus for subjecting a wafer surface to treatment according to a second embodiment of the present invention.

FIG. 6 shows an apparatus according to a second embodiment, in which a slight modification is added to the structure of the first embodiment. The apparatus shown in FIG. 6 is different from the apparatus shown in FIG. 4 in that a plurality of through-holes 9 is formed in the bottom wall 6b at the end of the cylindrical body 6. Except for those through-holes 9, this apparatus is the same as that shown in FIG. 4 and the flow of developer Q flowing out through the outlet holes 8 formed in the side wall 6a spreads uniformly on the wafer W. The developer flowing out through the outlet holes 8 does not cause any unevenness on the surface of the wafer W.

In the apparatus shown in FIG. 6, the developer Q flows out from the through-holes 9 onto the wafer W. Consequently, developer Q is adequately supplied also to the central area of the wafer W. If the number and size of the holes 9 are not suitably set, unevenness could occur in a corresponding area of the surface of the wafer W. According to experiments conducted by the inventors, the developing process is optimized when the bottom wall 6b had five holes 9 and each hole 9 had a diameter of 3.3mm.

COMPARISON TEST

Figure 2:
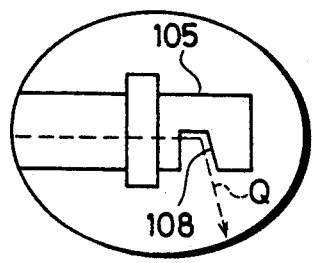
FIG. 2 is a side view of a nozzle used in the conventional apparatus.
Figure 3:
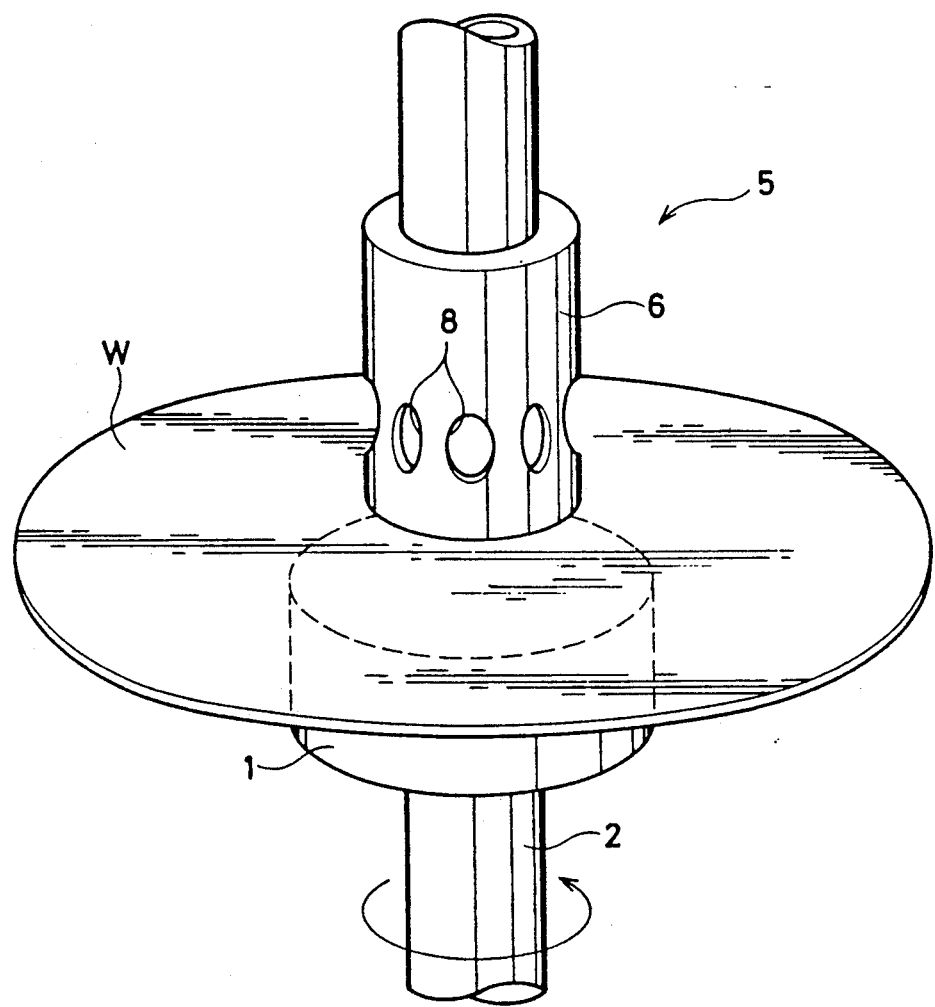
FIG. 3 is a perspective view of a main portion of an apparatus for subjecting a wafer surface to treatment according to the present invention.

The inventors of the present invention carried out experiments, as described below for comparing the apparatus according to the present invention as shown in (FIG. 4) with conventional apparatus having a nozzle for dispersing a treatment liquid like a spray, as shown in FIGS. 1 and 2.

A plurality of wafers were prepared. A photoresist TMSR-8900 (25CP), a product of Tokyo Ohka Kogyo Co., Ltd. was applied to each wafer to a thickness of 1.25 $\mu$m. Each wafer was heated at 85° C. for 90 seconds. After that, the photoresist layer on each wafer was exposed to G-line light (of a wavelength 436nm) according to a prescribed pattern.

Each wafer was heated again at 115° C. for 80 seconds. one-half of the heated wafers were subjected to development with apparatus according to the present invention and the other half of the wafers were subjected to development with conventional apparatus.

The developer used in the experiment was NMD-3, also a product (2.38%) of Tokyo Ohka Kogyo Co., Ltd. NMD-3 is an aqueous solution consisting solely of TMAH (tetramethylammonium hydroxide). The value, "2.38%", represents a percent of TMAH by weight in the agreeous solution. The temperature of the developer was 23.0° C.

In a test employing conventional apparatus, the developing process was carried out in the following manner. The developer was supplied to the wafer for 7 seconds under a pressure of 0.7 kg/cm$^2$. The supply rate of the developer was 500 ml/min. During the supply, the wafer was kept rotating. After the supply of the developer, the rotation of the wafer was stopped and the photoresist layer on the wafer was subjected to development for 38 seconds. The consumed developer was 58 ml per wafer.

In a test employing apparatus according to the present invention, the developing process was carried out in the following manner. The developer was supplied to the wafer for 3 seconds under a pressure of 0.9 kg/cm$^2$. The supply rate of the developer was 640 ml/min. During the supply, the wafer was kept rotating. After the supply of the developer, the rotation of the wafer was stopped and the photoresist layer on the wafer was subjected to development for 42 seconds. The consumed developer was 32 ml per wafer.

In each of the above-mentioned two cases, the pressure indicated above is a pressure applied to the container. The pressure of the developer in the nozzle in each case was lower than that due to a pressure loss caused by a filter or the like, not shown, which was provided in the apparatus and through which the developer was supplied.

The results of these experiments are shown in Table 1. The results of the development were evaluated in terms of deviation of a resist line-width in the same) wafer. The deviation is expressed by a value 3$\sigma$(sigma). The character $\sigma$ represents a concept used in statistics. The smaller $\sigma$(hence, $\sigma^2$) is, the smaller is the deviation from the mean. The resist line-width was about 1.4 $\mu$m.

TABLE 1

| | apparatus of the invention | conventional apparatus |
|---|---|---|
| deviation of resist line-width in the same wafer | $3\sigma = 0.023(\mu m)$ | $3\sigma = 0.05(\mu m)$ |
| bubbles in developer | none | many |
| consumption of developer | 32 ml/wafer | 58 ml/wafer |
| shock caused by discharge of developer | little | significant |

As is evident from Table 1, according to the present invention, the deviation in the line-width is smaller by 0.027 μm in terms of $3\sigma$. Thus, the present invention has made an improvement in evenness in the process.

According to the present invention, no bubbles were observed in the developer during the process. Although a large pressure was applied to the developer, there was little shock caused by discharge of the developer according to the present invention. In addition, the evenness in the process was improved and the consumption of the developer was small. The reasons are that the flow of developer loses its speed at the lower end of the nozzle in a direction normal to the wafer surface and the developer spreads rapidly in the direction parallel to the wafer surface. A sufficient amount of the developer was supplied in a short period to cover the entire surface of the wafer.

From those results of the experiment for comparison, it can be clearly understood that the apparatus according to the present invention provides remarkable advantages and is distinguishable over the conventional apparatus.

Figure 7:
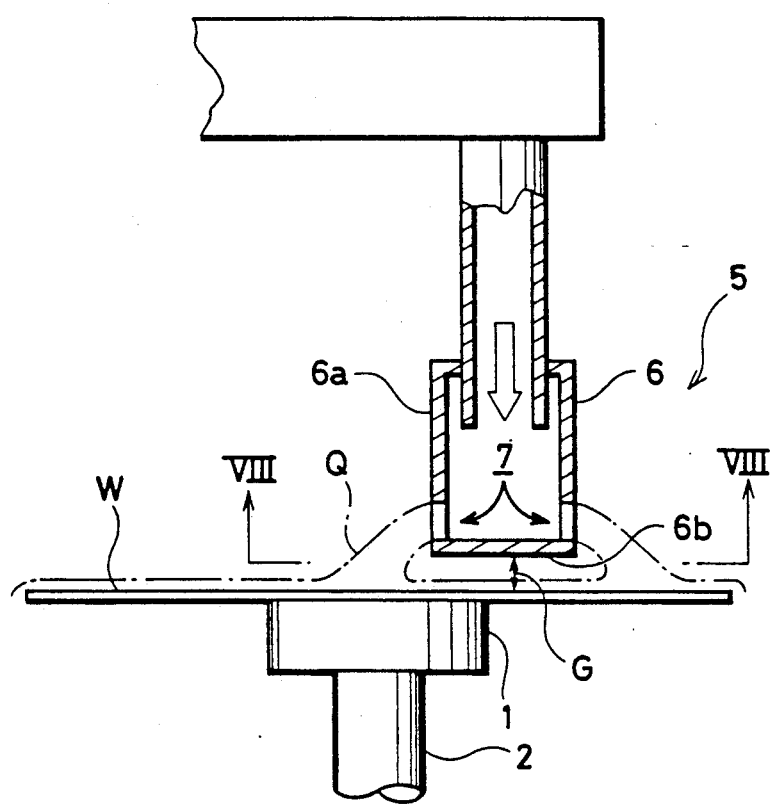
FIG. 7 is a partial fragmentary sectional view of a main part of an apparatus according to a third embodiment of the invention.

FIG. 7 is a partial fragmentary sectional view of a main part of an apparatus according to a third embodiment of the present invention. The apparatus shown in FIG. 7 is different from the apparatus shown in FIG. 4 in the following points. The lowest end of each outlet hole 8 provided in the side wall 6a of the cylindrical body 6 is at the same level as that of the upper surface of the bottom wall 6b and the center axis of the nozzle 5 is displaced from the rotating axis of the wafer W by a predetermined distance.

Figure 8:
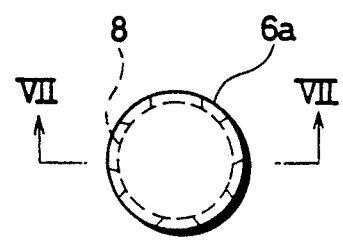
FIG. 8 is a bottom plan view of the nozzle of the apparatus illustrated in FIG. 7.

Referring to FIG. 8, the nozzle 5 has five outlet holes 8. One of the outlet holes 8 is directed toward the rotating axis of the wafer W. The distance G between the lower end of the nozzle 5 and the upper surface of the wafer W preferably is approximately 4.5 mm. The center axis of the nozzle 5 is preferably displaced from the center axis of the wafer W by about 14 mm.

The operation of the apparatus shown in FIGS. 7 and 8 is very similar to that of the apparatus of the first embodiment and a detailed description thereof, therefore, is not repeated here.

In this apparatus, the treatment liquid supplied to the nozzle 5 is obstructed at the bottom of the nozzle 5 and is discharged through the outlet holes 8 in a direction parallel to the upper surface of the wafer W. The speed of the flow of the treatment liquid in the horizontal direction is larger than that in the first and second embodiments since the lowest end of each outlet hole 8 is at the same level as that of the upper surface of the bottom wall 6b. Consequently, a relatively large amount of the treatment liquid is supplied in a shorter period to adequately cover the surface of the wafer W.

Since the nozzle 5 in the embodiment of FIG. 7 is displaced from the rotating axis of the wafer W, the treatment liquid can be also supplied sufficiently to the center of rotation of the wafer W. Thus, the upper surface of the wafer W is uniformly treated.

In the above-described embodiment, the distance G between the lower end of the nozzle 5 and the upper surface of the wafer W preferably is set to be approximately 4.5 mm in an exemplary device. This distance G is to be selected in practice to be such as to allow no contact between the lowest end surface of the nozzle 5 and the liquid film being formed on the upper surface of the wafer W. Therefore, in practice this distance may vary depending on parameters such as the supply rate of the treatment liquid and the rotating speed of the wafer W.

The reason for selecting the distance G to ensure that no contact occurs between the lower end of the nozzle 5 and the liquid film being formed on the upper surface of the wafer W is that the treatment liquid of the liquid film should not adhere to the nozzle 5. Otherwise, the treatment liquid being supplied from the nozzle could be contaminated or deteriorated by the treatment liquid supplied earlier and thereafter adhered to the nozzle and the subsequent wafer might be contaminated.

The above-mentioned nozzle 5 has another advantage as described below. The lower end of the nozzle 5 has no space allowing the treatment liquid to stay. Therefore, when the supply of the treatment liquid is stopped, there need be no concern that some residue of liquid may stay inside the lower end of the nozzle and may be deteriorated by chemical reaction with air.

In the above-described respective embodiments, the apparatus for applying the developing process to the wafer surface is described by way of examples. However, the present invention is not limited thereto. The present invention is widely applicable to any apparatus for treating a wafer surface by supplying a treatment liquid to the wafer surface.

Although the present invention has been described and illustrated in detail, it should be clearly understood that the same is by way of illustration and example only and is not to be taken by way of limitation, the spirit and scope of the present invention being limited only by the terms of the appended claims.

What is claimed is:

1. An apparatus for treating a wafer having a first surface to be treated and a second surface opposite to the first surface, comprising:
    water holding means for holding said wafer such that the wafer is rotatable around a rotation axis at the center of said second surface; and
    nozzle means for supplying a predetermined flow of a treatment liquid onto said first surface of said wafer held by said wafer holding means,
    said nozzle means including
    supply means for supplying a flow of said treatment liquid at a predetermined first flow speed to a predetermined position higher than said first surface by a predetermined distance, and
    flow changing means for changing a speed of said treatment liquid from said first flow speed to a smaller second flow speed at said predetermined position and providing a speed component in a direction parallel to said first surface to a speed of said treatment liquid;
    said flow changing means including
    obstruction means for obstructing said flow of said treatment liquid supplied by said supply means at said predetermined position, and flow enabling means for enabling said obstructed flow of treatment liquid to flow in the direction parallel to said first surface from said predetermined position.

2. The apparatus in accordance with claim 1, wherein:
said flow enabling means includes a side plate contacting a peripheral edge of said obstruction means, said side plate extending upward from said obstruction means and having an outlet hole through which said treatment liquid flows out.

3. The apparatus in accordance with claim 2, wherein:
said side plate has a plurality of said outlet holes.

4. The apparatus in accordance with claim 3, wherein:
said plurality of said outlet holes are located at a common level spaced at a predetermined distance from said first surface of said wafer.

5. The apparatus in accordance with claim 3, wherein:
each of said outlet holes is a round hole having an equal diameter.

6. The apparatus in accordance with claim 4, wherein:
said side plate comprises a hollow cylinder and said outlet holes are disposed in said side plate at equal intervals.

7. The apparatus in accordance with claim 1, wherein:
said obstruction means includes an obstruction plate provided in a flow path of said treatment liquid at said predetermined position.

8. The apparatus in accordance with claim 7, wherein:
said obstruction plate has a flat upper surface.

9. The apparatus in accordance with claim 8, wherein:
said obstruction plate is disposed with said upper surface parallel to said first surface.

10. The apparatus in accordance with claim 8, wherein:
said upper surface has a circular outline.

11. The apparatus in accordance with claim 7, wherein:
said obstruction plate has a lower surface facing said first surface and has a through-hole penetrating from said upper surface to said lower surface.

12. The apparatus in accordance with claim 11, wherein:
said obstruction plate has a plurality of through-holes.

13. The apparatus in accordance with claim 12, wherein:
said obstruction plate has a plurality of said through-holes of the same diameter.

14. The apparatus in accordance with claim 10, wherein:
said flow enabling means includes a side plate contacting said obstruction plate at a periphery of said obstruction plate, said side plate extending upward from said obstruction plate and having an outlet hole through which said treatment liquid flows out.

15. The apparatus in accordance with claim 14, wherein:
said side plate defines a cylindrical space, and said supply means comprises a cylinder having a hollow portion communicating with said cylindrical space, and
said side plate and said obstruction plate are fixed to an end of said supply means.

16. The apparatus in accordance with claim 14, wherein:
the lowest part of said outlet hole is at the same level as said flat upper surface.

17. The apparatus in accordance with claim 16, wherein:
said side plate defines a cylindrical space; and
a center axis of said cylindrical space is spaced from said rotation axis by a predetermined distance.

18. The apparatus in accordance with claim 16, wherein:
said flow enabling means is formed to have a plurality of outlet holes each having a lowest part at the same level as said flat upper surface; and
said flow enabling means is arranged such that one of said outlet holes is directed toward said rotating axis.

* * * * *